(12) United States Patent
Ollier

(10) Patent No.: US 9,527,729 B2
(45) Date of Patent: Dec. 27, 2016

(54) PROCESS FOR FABRICATION OF A MICROMECHANICAL AND/OR NANOMECHANICAL STRUCTURE COMPRISING A POROUS SURFACE

(71) Applicant: COMMISSARIAT A L'ENERGIE ATOMIQUE ET AUX ENE ALT, Paris (FR)

(72) Inventor: Eric Ollier, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 0 days.

(21) Appl. No.: 14/182,659

(22) Filed: Feb. 18, 2014

(65) Prior Publication Data

US 2015/0274516 A1    Oct. 1, 2015

(30) Foreign Application Priority Data

Feb. 19, 2013 (FR) .................................... 13 51400

(51) Int. Cl.
*B81C 1/00* (2006.01)

(52) U.S. Cl.
CPC ....... *B81C 1/00515* (2013.01); *B81C 1/00206* (2013.01); *B81C 1/00412* (2013.01);
(Continued)

(58) Field of Classification Search
CPC ............. B81C 1/00476; B81C 1/00206; B81C 1/00412; B81C 1/00626; B81C 1/00507; B81C 1/00293; B81C 1/00301; B81C 2201/0115; B81C 2201/0136; B81C 2203/0136; B81C 2203/0145; B81C 2201/00; H03H 9/2436; H03H 3/0072; H03H 9/175; B81B 7/0077; B81B 7/0006; B81B 2201/0271; H01L 21/20; G01P 15/0802
(Continued)

(56) References Cited

U.S. PATENT DOCUMENTS 6,012,336 A * 1/2000 Eaton .................. B81C 1/00246
                                                  73/754
6,200,878 B1    3/2001 Yamagata et al.
(Continued)

FOREIGN PATENT DOCUMENTS

CN    1486277 A    3/2004
CN    1495877 A    5/2004
(Continued)

OTHER PUBLICATIONS

French Preliminary Search Report issued Nov. 14, 2013 in Patent Application No. 1351400.
(Continued)

*Primary Examiner* — Bac Au
(74) *Attorney, Agent, or Firm* — Oblon, McClelland, Maier & Neustadt, L.L.P.

(57) ABSTRACT

Process for fabrication of a micromechanical and/or nanomechanical structure comprising the following steps, starting from an element comprising a support substrate and a sacrificial layer:
  a) formation of a first layer, at least part of which is porous,
  b) formation on the first layer of a layer made of one (or several) materials providing the mechanical properties of the structure, called the intermediate layer,
  c) formation on the intermediate layer of a second layer, at least part of which is porous,
  d) formation of said structure in the stack composed of the first layer, the intermediate layer and the second layer,
(Continued)

e) release of said structure by at least partial removal of the sacrificial layer.

27 Claims, 6 Drawing Sheets

(52) U.S. Cl.
CPC .. *B81C 1/00626* (2013.01); *B81C 2201/0114* (2013.01); *B81C 2201/0115* (2013.01); *B81C 2201/038* (2013.01)

(58) Field of Classification Search
USPC .................................................. 438/52, 619
See application file for complete search history.

(56) References Cited

U.S. PATENT DOCUMENTS

| | | | | |
|---|---|---|---|---|
| 7,075,160 | B2* | 7/2006 | Partridge | B81C 1/00333 257/414 |
| 7,906,439 | B2* | 3/2011 | Perruchot | B81C 1/00507 257/E21.115 |
| 8,183,078 | B2 | 5/2012 | Ollier et al. | |
| 8,580,597 | B2 | 11/2013 | Ollier et al. | |
| 8,669,822 | B2* | 3/2014 | Lander | H03H 3/0072 29/25.35 |
| 2004/0195096 | A1 | 10/2004 | Tsamis et al. | |
| 2008/0030825 | A1 | 2/2008 | Sasagawa et al. | |
| 2009/0267166 | A1* | 10/2009 | Verheijden et al. | 438/51 |
| 2010/0006840 | A1* | 1/2010 | Robert | B81C 1/00039 257/49 |
| 2011/0127625 | A1* | 6/2011 | van der Avoort | H03H 3/0076 257/418 |
| 2011/0221013 | A1 | 9/2011 | Partridge et al. | |
| 2011/0221015 | A1 | 9/2011 | Gaillard et al. | |
| 2012/0115311 | A1 | 5/2012 | Desplobain et al. | |
| 2012/0308779 | A1* | 12/2012 | Klee | B01D 53/228 428/158 |
| 2013/0137245 | A1* | 5/2013 | Robert | H01L 21/20 438/478 |
| 2013/0168852 | A1* | 7/2013 | Liang | B81C 1/00293 257/737 |
| 2014/0162392 | A1 | 6/2014 | Ollier et al. | |
| 2015/0021720 | A1 | 1/2015 | Ollier et al. | |

FOREIGN PATENT DOCUMENTS

| | | |
|---|---|---|
| CN | 1748321 A | 3/2006 |
| CN | 1826682 A | 8/2006 |
| CN | 1914115 A | 2/2007 |
| CN | 101528589 A | 9/2009 |
| CN | 102740958 A | 10/2012 |
| CN | 102556946 B | 10/2014 |
| EP | 1 683 757 A1 | 7/2006 |
| EP | 2 364 953 A1 | 9/2011 |

OTHER PUBLICATIONS

Yongha Hwang, et al., "Porous Silicon Resonators for Improved Vapor Detection" Journal of Microelectromechanical Systems, vol. 21, No. 1, XP011403353, Feb. 1, 2012, pp. 235-242.
S. Stolyarova, et al., "Composite porous silicon-crystalline silicon cantilevers for enhanced biosensing" Sensors and Actuators B, vol. 131, No. 2, XP022635083, May 14, 2008, pp. 509-515.
A. Niel, et al., "VLSI silicon multi-gas analyzer coupling gas chromatography and NEMS detectors" Electron Devices Meeting (IEDM), IEEE International IEDM Conference, 2011, pp. 29.3.1.-29.3.4.
M. Saadoun, et al., "Vapour-etching-based porous silicon: a new approach" Thin Solid Films, vol. 405, 2002, pp. 29-34.
U.S. Appl. No. 14/514,703, filed Oct. 15, 2014, Ollier, et al.
U.S. Appl. No. 14/335,175, filed Jul. 28, 2014, Ollier, e t al.
Office Action issued Aug. 3, 2016 in Chinese Application No. 2014100568645 with English Translation.

* cited by examiner

PROCESS FOR FABRICATION OF A MICROMECHANICAL AND/OR NANOMECHANICAL STRUCTURE COMPRISING A POROUS SURFACE

TECHNICAL FIELD AND PRIOR ART

This invention relates to a process for making a micromechanical and/or nanomechanical structure particularly of the suspended MEMS and/or NEMS type comprising layers of porous materials, said structure being particularly suitable for making sensors.

Micro-Electro-Mechanical-Systems (MEMS) are currently used at the present time in many products in daily life. New applications are also emerging particularly due to the emergence of Nano-Electro-Mechanical-Systems (NEMS) that have many advantages due to the reduction in the dimensions of mechanical structures. One field of interest relates to humidity sensors, chemical or biological sensors that use the fact that the layers of porous materials facilitate interaction between the sensor and the external medium, for example by improving the adsorption of molecules.

For example, the document "*VLSI silicon multi-gas analyzer coupling gas chromatography and NEMS detectors*" A. Niel, V. Gouttenoire, M. Petitjean, N. David, R. Barattin, M. Matheron, F. Ricoul, T. Bordy, H. Blanc, J. Ruellan, D. Mercier, N. Pereira-Rodrigues, G. Costa, V. Agache, S. Hentz, J. C. Gabriel, F. Baleras, C. Marcoux, T. Ernst, L. Duraffourg, E. Colinet, P. Andreucci, E. Ollier, P. Puget and J. Arcamone, IEDM Conference 2011 describes an example NEMS structure forming a gravimetric sensor. The NEMS structure comprises a vibrating structure on the surface of which gas molecules are adsorbed, which has the effect of modifying its mass and therefore its resonant frequency. This modification is measured through piezoresistive gauges and therefore variations in the gas concentration can be monitored by monitoring the resonant frequency of the structure.

The problem of MEMS/NEMS systems as described in this document for gas sensor or biological sensor applications concerns the interface between the external medium and the sensitive structure. An attempt is made to optimise this interaction and particularly to favour adsorption of molecules in or on this structure while maintaining good mechanical properties for this mechanical structure.

Porous materials may be used to better adsorb molecules. Porous silicon is very interesting because it can have different porosities. It may be microporous with pore diameters of less than 2 nm, mesoporous with pore diameters of between 2 nm and 50 nm, or macroporous with pore diameters of more than 50 nm.

Document US 2004/0195096 discloses a process for fabrication of a gas sensor comprising cantilever type or embedded-embedded beam type structures with a fully porous silicon surface technology. Therefore, the mechanical structure is composed of a porous material throughout its thickness. The fact that the entire structure is made of a porous material may make it more difficult to obtain high quality mechanical properties, for example for a resonant structure.

Document US 2011/0221013 discloses encapsulation of a MEMS structure by a porous material. But it is impossible to localise the porous layer because the porous layer is formed on the previously formed mechanical structure.

The document entitled "*Composite porous silicon-crystalline silicon cantilevers for enhanced biosensing*", S. Stolyarova, S. Cherian, R. Raiteri, J. Zeravik, P. Skladal, Y. Nemirovsky, *Sensors and Actuators B* 131 (2008) 509-515 describes the formation of a porous silicon layer on the lower surface of a mobile mechanical structure made of monocrystalline silicon that has previously been formed from an SOI substrate. The porous silicon formed can immobilise a wide variety of chemical and/or biological substances that can significantly improve sensitivities.

The porous layer is not localised at the released mechanical structure. Since the porous silicon is formed after the step in which the mechanical structure is formed, all of this structure in which silicon is visible is covered by porous silicon. However, this is undesirable for many MEMS/NEMS structures in which actuation and/or detection parts are also partly mobile structures or for structures with a resonant part. Electrodes for capacitive type actuation and/or detection means would be covered by porous silicon; for piezoresistive detection, strain gauges would be covered by or even formed from porous silicon, and faces would also be covered by porous silicon for resonant structures. Quality factors can be degraded because of energy losses due to the porous surface.

It is preferable for all these parts to have monocrystalline silicon with very good surface conditions derived by etching monocrystalline silicon material, in order to achieve good performances, or more generally these parts should be made of monocrystalline or polycrystalline materials with very good surface conditions rather than a porous material.

PRESENTATION OF THE INVENTION

Consequently, one purpose of this invention is to disclose a process for fabrication of a micromechanical and/or nanomechanical structure and more particularly a Micro-Electro-Mechanical and/or Nano-Electro-Mechanical structure (MEMS and/or NEMS) with very good mechanical properties and a large surface area of porous material that in particular can adsorb and/or absorb species of interest.

The previously mentioned purpose is achieved by a process for making mechanical structures comprising an intermediate material between two layers made of materials with a porosity higher than the porosity of the intermediate material, the intermediate material having mechanical properties, and the layers of porous materials being intended for adsorption or absorption of species of interest.

Other properties of the porous layers, for example electrical insulation and/or thermal insulation properties, make the invention attractive. In particular, these properties can make it possible to use the structure for applications other than those in which species of interest are adsorbed or absorbed.

To achieve this, the process includes the following steps performed on a substrate with a sacrificial layer:

formation of a first layer, of which at least part is made from a porous material on the sacrificial layer, formation of a layer made of one or several materials with required mechanical properties for the structure, formation of a second layer, at least part of which is made of a porous material, on the layer made of one or several materials with required mechanical properties for the structure, formation of the mechanical structure in the previous layers and release of the mechanical structure by at least partial removal of the sacrificial layer.

With this process, at least part of the lower and upper faces of the mechanical structure may be covered by a porous material, therefore the absorption surface area is increased and mechanical properties are guaranteed because the layer forming the mechanical structure is not affected.

Very advantageously, the porous zones of the first layer and the second layer are formed and are localised on the substrate such that at the end of the process, only the suspended mechanical structure or part of this structure comprises zones made of the porous material. To achieve this, masks are used for making the first and second layers that are formed or etched so as to keep the porous material in localised zones. Thus, actuation and/or detection means may be free of the presence of porous material and their performances are not degraded by the presence of a porous material.

In one very advantageous example, the first and second porous layers are made of porous silicon and the layer providing mechanical properties is made of monocrystalline silicon.

The subject-matter of this invention is then a process for fabrication of a micromechanical and/or nanomechanical structure comprising the following steps starting from an element comprising a support substrate and a sacrificial layer:
  a) formation of a first layer, at least part of which is porous,
  b) formation on the first layer of a layer providing the mechanical properties of the structure, called the intermediate layer,
  c) formation on the intermediate layer of a second layer, at least part of which is porous,
  d) formation of said structure in the stack composed of the first layer, the intermediate layer and the second layer,
  e) release of said structure by at least partial removal of the sacrificial layer.

In this application, a layer refers to a homogenous layer of material or a heterogeneous layer composed of several materials. Furthermore, the so-called intermediate layer is preferably non-porous or has a porosity of less than the porosity of the first and second layers but it could possibly be porous if it performs its mechanical function.

In one advantageous example, the porous part of the first layer may be at least partially superposed on the porous part of the second layer. For example, the first and second porous layers may be localised differently from each other. As a variant, only one of the two layers would be localised.

Advantageously, the porous part of the first layer and/or the porous part of the second layer may have an open type porosity, i.e. in which pores communicate with each other to enable circulation of gas species in the porous layer(s), in some applications such as for example gas or humidity sensor applications.

Preferably, the materials in the first and/or second porous layers are chosen independently among semiconductors, dielectrics and particularly low permittivity dielectrics.

The first and second layers may have hydrophilic or hydrophobic properties. To achieve this, they may have been subjected to treatments such as plasma treatments to modify their surface of in-depth chemical properties.

For example, step a) and/or step c) comprise a step for the deposition, growth or transfer of a layer onto the sacrificial layer and/or the intermediate layer.

Advantageously, the porous parts of the first and/or the second layer are localised, localisation being achieved for example by localised deposition, growth, transfer or localised etching.

It will be understood that the porosity of the layer could be intrinsic to the layer.

Step a) and/or step c) may comprise a step to porosity at least one part of said layer. For example, a mask is made on said layer before the porosification step is done, so as to localise at least one zone of material to be made porous. The mask may be a hard silicon nitride mask. Porosification can be achieved electrochemically (anodisation) or by stain etching.

The material from which the first and/or second layer is made may be a P-doped and preferably a P+ doped semiconductor.

The material from which the intermediate layer is made is advantageously a monocrystalline material.

Step b) may comprise the step for epitaxial growth of the intermediate layer on the first layer.

Step d) in which said structure is formed in the stack composed of the first layer, the intermediate layer and the second layer may comprise a lithography and anisotropic etching step of said stack.

The structure may be released by isotropic etching of the sacrificial layer.

The material of the sacrificial layer is preferably chosen to be different from the material of the first layer, the second layer and the intermediate layer.

For example, the material in the sacrificial layer may have been treated, for example by doping.

In one example embodiment, the first and second layers are made of porous silicon and the intermediate layer is made of monocrystalline silicon.

In another example embodiment, the first and second layers are made of porous SiGe and the intermediate layer is made of non-porous SiGe.

In another example, the first and second layers are made of porous SiC and the intermediate layer is made of non-porous SiC.

Preferably, the structure comprises a fixed part and a suspended part on a support and means of actuating the suspended part and means of detecting displacement of the suspended part, the suspended part being provided with at least one porous zone formed during steps a) and c) on its first face facing the support and its second face opposite the first face.

The actuation means may for example be electrostatic and comprise electrodes located on flanks of the fixed and suspended parts without any porous zone.

In one example embodiment, the detection means are capacitive and comprise electrodes located on flanks of the fixed and suspended parts without any porous zone. In another example embodiment, the detection means comprise piezoresistive gauges extending between the fixed part and the suspended part, said gauges not being provided with a porous zone.

One or several porous lateral layers may be formed on flanks of the suspended part and/or the fixed part.

The micromechanical and/or nanomechanical structure thus obtained may be used for fabrication of a chemical and/or biological sensor, and/or a humidity sensor, the porous zones being designed to adsorb molecules of interest.

BRIEF DESCRIPTION OF THE DRAWINGS

This invention will be better understood after reading the following description with reference to the appended drawings in which.

DETAILED PRESENTATION OF PARTICULAR EMBODIMENTS

Figure 1A:
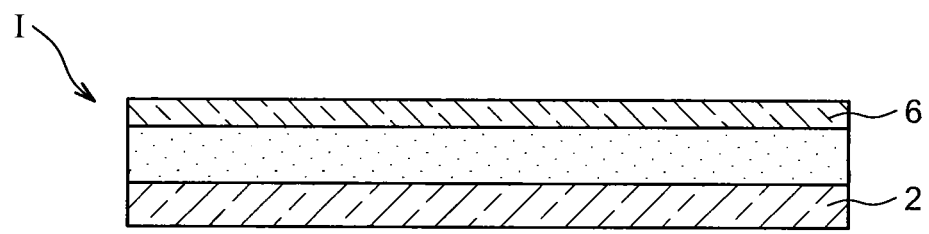
FIGS. 1A to 1H are diagrammatic representations of the different steps in an example of the process for fabrication of a MEMS and/or NEMS mechanical structure according to the invention comprising at least one layer of porous material on its lower face and on its upper face.

FIGS. 1A to 1H represent the steps in an example process for fabrication of a MEMS and/or NEMS type mechanical structure comprising layers of porous materials on its upper and lower faces.

In this application, the lower face of the structure is the face of the structure facing the substrate on which the structure is made and the upper face of the structure is oriented towards the outside of the structure and is opposite the lower face.

For simplification reasons in the description of the fabrication process, the layers of porous material are made of porous silicon and the structure is made of monocrystalline silicon. Other examples of materials for these layers will be described later.

Starting from an element I comprising for example a substrate 2 made of silicon, a sacrificial layer 4 for example made of silicon oxide 4 such as BOX (Buried OXide) formed on the substrate 4, and a silicon layer 6 formed on the sacrificial layer 4. The element I may be an 501 ("Silicon On Insulator") wafer. The thickness of the silicon layer 6 may for example be between a few tens of nm and a few hundred nm.

This element I is shown in FIG. 1A.

The first layer made of a porous material is made in the layer 6. Preferably, the silicon is P+ doped which facilitates the electrochemical formation (anodising) of porous silicon. It may also be of the P type, doping for which an electrochemical etching process will also preferably illuminate the back face to enable circulation of carriers towards the zone to be porosified. As a variant, another type of doping, even an N doping, can be done depending on the porosification process used.

In a next step, the zone of the layer 6 in which it is required to make the porous portion is delimited by means of a mask formed on the layer 6, for example a hard mask. The mask material is chosen so as to resist porosification techniques. For example, the mask may be made from silicon nitride that resists anodic dissolution in the presence of hydrofluoric acid.

As a variant, other layers may be used as a hard mask depending on the porosification techniques used, namely $Si_3N_4$, $SiO_2$, SiGe, SiC, polycrystalline silicon and combinations of them. As a variant, it is also possible to use ionic implantation techniques to make the mask material resistant to the porosification technique.

The mask is made by depositing a layer 8 made of one or more combinations of the materials mentioned above over the entire surface of the silicon layer 6 and etching it using conventional photolithography techniques to open the zones 10 providing access to the silicon layer 6.

Figure 1B:
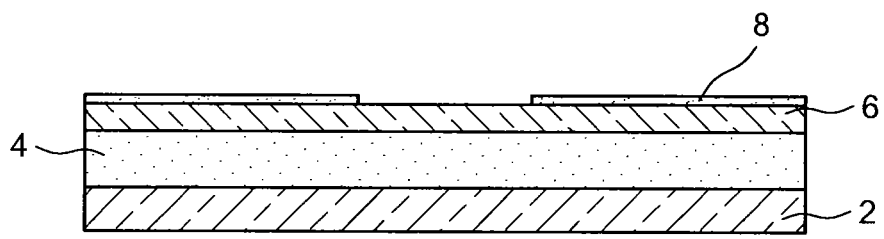

FIG. 1B shows the element thus formed.

The next step consists of porosification of the zone 10 of the silicon layer 6. A porosification technique is then used. For example, electrochemical porosification (anodisation) can be used in which porosification is achieved by anodic dissolution in the presence of hydrofluoric acid. This technique has the advantage that it can be used to obtain various thicknesses and porosities depending on the doping of the layer in which the porosity is made and depending on process conditions.

Thicknesses may vary from a few tens of nanometers to several tens of micrometers. The pore size may vary from a few nanometers to a few micrometers, giving what can be called microporous, mesoporous or macroporous silicons. Anodisation conditions, for example concentration of hydrofluoric acid, the current density, the duration and the doping, i.e. lack of doping, N or P doping and the concentration of doping agents, of the layer in which the porosity is formed (in this case layer 6) control the characteristics of the porous layer.

Porosification preferably takes place throughout the thickness of the layer 6. Thus, zone 10 extends from the sacrificial layer to the free face of the layer 6.

Other porosification techniques may be used, for example the stain etching technique described for example in document "Vapor-etching-based porous silicon formation", M. Saadoun, N. Mliki, H. Kaabi, K. Daoubi, B. Bessais, H. Ezzaouia, R. Bennaceur, *Vapour-etching-based porous silicon: a new approach, Thin Solid Films* 405 (2002) 29-34. This technique also called Reactive Induced Vapor Phase Stain Etch (RIVPSE), consists of exposing the layer to be made porous to vapours produced by silicon etching in an HF: HNO3: CH3COOH mix. One of the advantages of this technique is the fact that there is no need to create electrical contacts between the front and back faces of the substrate nor to dip the element into a liquid solution as is the case for the electrochemical technique and that it is easier to form porous silicon on any type of substrate, for example an SOI substrate. Chemical etching usually using an electrolyte based on hydrofluoric acid and nitric acid, has the advantage of being a simple and economic technique.

Figure 1C:
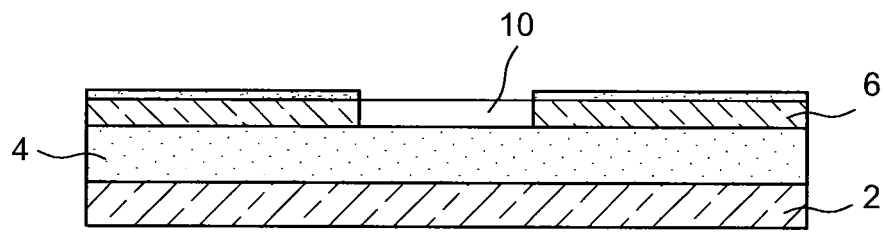

The element thus formed is shown in FIG. 1C.

In a next step, the mask may be eliminated for example by etching.

Figure 1D:
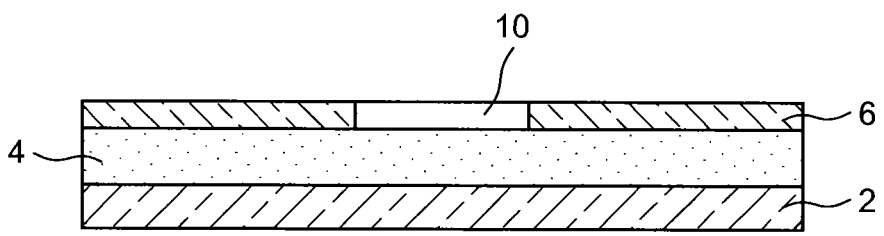

The element thus formed is shown in FIG. 1D.

During a next step, a layer of monocrystalline silicon 12 is formed on the layer 6 provided with the porous zone 10, inside which the mechanical structure will be made.

For example, the layer 12 is formed by epitaxial growth on the layer 6 provided with the porous zone 10. For example, the thickness of the layer 12 is between a few tens of nm and a few hundred nanometers. Such epitaxial growth is disclosed for example in document EP 2364953. This growth is obtained using the epitaxial growth technique for silicon which is well known to those skilled in the art. The morphology of the porous Si is well stabilised before this growth takes place, for example by a vacuum heat treatment.

Figure 1E:
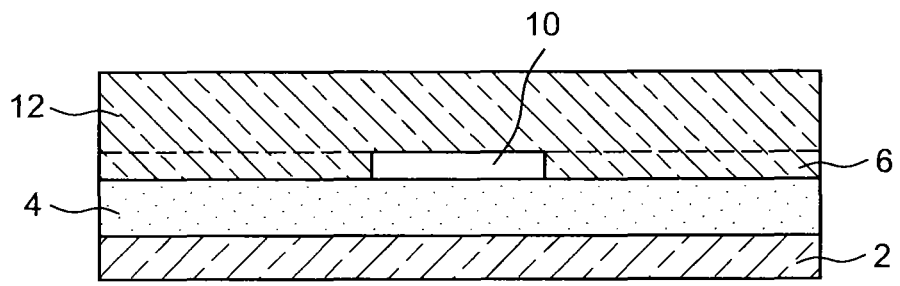

The element thus formed is shown in FIG. 1E.

During a next step, a second porous silicon zone 14 is made in the layer 12 for example vertically in line with the first porous silicon zone 10. This is done by using the same steps as were used for the formation of the first zone 10, i.e. a mask is made on the layer 12 and the accessible layer 12 is porosified. Unlike the production of zone 10, zone 14 is not produced throughout the thickness of the silicon layer 12, but over part of its thickness. The thickness of the zone 14 may be equal to or different from the thickness of zone 10. For example, the check on the thickness of the layer 14 may be made continuously over time.

The porous zones 10 and 14 may or may not be vertically in line with each other. For example, if it is required to maximise the porous surface, it is interesting to partially cover the detection means for example piezoresistive gauges, by increasing the upper porous surface area, while avoiding a lower porous layer at these structures so as to obtain an optimum crystalline quality at these structures. In this way, the material that will form these structures could be generated from monocrystalline Si rather than porous Si in the case in which the lower porous layer was made on a monocrystalline Si layer, which gives a better crystalline quality for these structures.

The mask is then eliminated by etching.

Figure 1F:
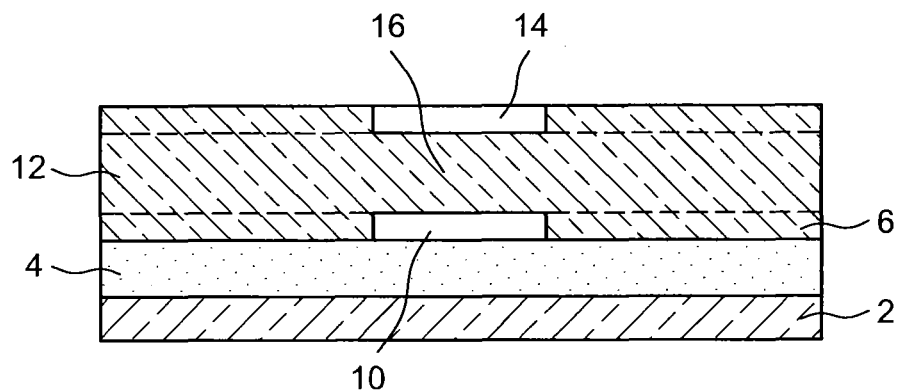

The element thus formed is shown in FIG. 1F.

The result obtained is then a monocrystalline silicon layer provided in some stack zones with two porous silicon zones 10, 14 on each side of a monocrystalline silicon zone 16. This zone will be referred to as the intermediate layer 16.

A planarisation step may be included, for example a mechanical-chemical step to ensure a good flatness of the assembly.

As a variant, the porous zones may also be localised by making a first and/or second fully porous layer(s) and then etching the first and/or second porous layer(s) so as to keep porous zones only at the required locations. Etching may for example be localised by a lithography step.

The intermediate layer 16 may be done by growth, and in this case growth is done on the sacrificial oxide layer, silicon is then polycrystalline, by deposition or by transfer. If transfer is used, a step to fill in between the porous zones for example with an oxide, and a planarization step are done before the intermediate layer is transferred. The intermediate layer may then be monocrystalline Si or polycrystalline Si.

The position of the porous zones is particularly interesting for the upper layer 12.

During a next step, the NEMS and/or MEMS structure is made in the stack of layers.

This is done by defining the patterns of the structure by photolithography in a resin, and then patterns in the stack are defined by anisotropic etching.

When making the NEMS and/or MEMS structure, some of the patterns are made in the monocrystalline silicon and the other patterns are made in the stack of porous zones 12, 14 and the intermediate layer 16, which can give a structure with some parts made only of monocrystalline silicon and other parts made of monocrystalline silicon covered by porous silicon on its lower and upper faces.

It will be understood that etching may be done on the inside or at the periphery of the zones of porous material to define the mechanical structure.

Figure 1G:
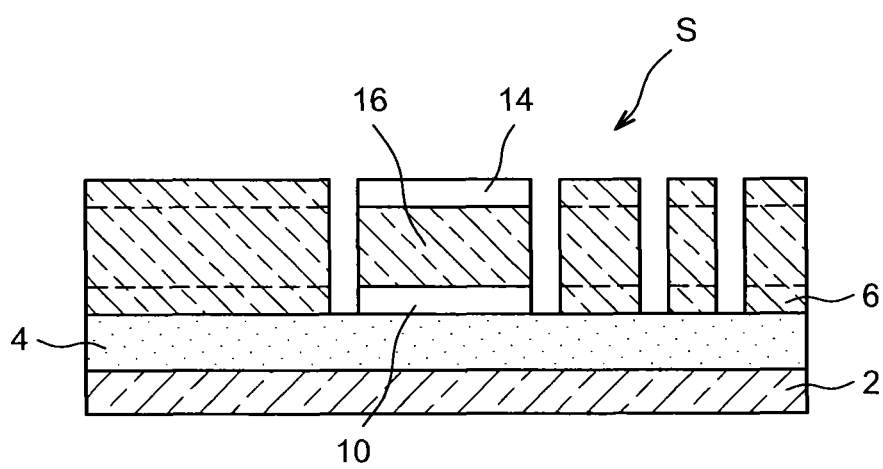

The element thus formed is shown in FIG. 1G.

In the example shown and advantageously, the etched elements comprising porous zones comprise monocrystalline silicon around their entire periphery. Etching used to define the mechanical structure is preferably done in a homogeneous material, namely monocrystalline silicon for all structural elements; thus the etching rate is constant. However, it would also be possible to do this etching in porous silicon in some locations to maximise the coverage of the surface of the mechanical structure by the porous material, and in this case any differences in the etching rate between the monocrystalline Si parts and the porous Si parts will be taken into account.

During a next step, if electrical contacts are required, then contact connections and metallic connection lines are made on the surface of the layer 12, for example made of AlSi that is a metal that has the advantage of resisting etching by hydrofluoric acid done to release the mechanical structure.

The mechanical structure is released in a subsequent step, for example by isotropic etching of the sacrificial layer over time, for example with hydrofluoric acid.

Figure 1H:
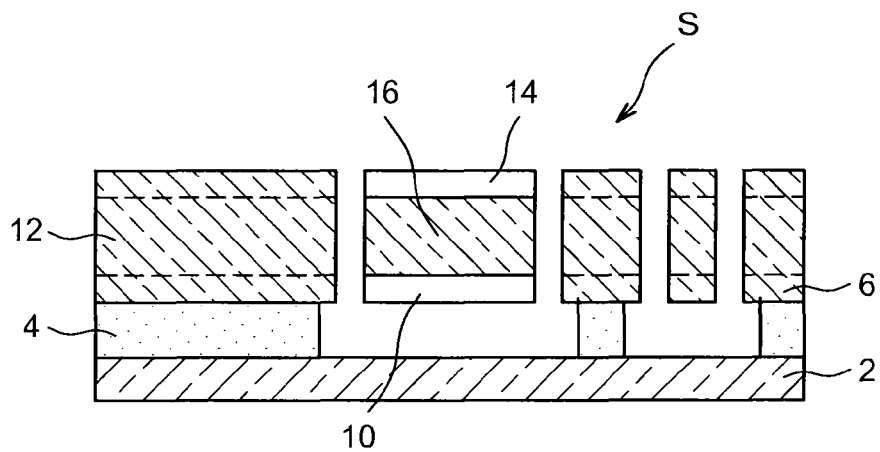

The element thus formed is shown in FIG. 1H. The structure comprises a part covered by porous silicon on its lower and upper faces and a part made of monocrystalline silicon only.

The suspended mechanical structure may be mobile or not in the application and if it is mobile, displacement may occur in the plane of the substrate or perpendicular to the plane of the substrate or along any other direction.

Thus, with the process according to the invention, a mechanical structure is made comprising a maximised surface area, for example designed for adsorption of species of interest, formed by the two porous zones on the two faces of the monocrystalline silicon layer, and mechanical properties of this structure are maintained due to the parts made of monocrystalline silicon only.

According to one variant of the process, steps to localise the porous zones are omitted, namely the steps to make masks on the monocrystalline silicon layer 6 formed above the sacrificial layer and on the monocrystalline silicon layer 12. Porous zones 110, 114 are then made over the entire surface of layers 6 and 12 respectively. The mechanical structure thus formed then comprises only one stack of two porous layers separated by a layer of monocrystalline silicon. Preferably, the patterns of the mechanical structure are etched by reactive ion etching (RIE), which is suitable for etching porous silicon.

According to another variant embodiment, the monocrystalline silicon layer is replaced by a polycrystalline silicon layer 212. For example, this layer may be formed by epitaxy on the layer on which the porous silicon zone 10 is located. No special precautions are necessary for the growth of silicon on the porous zone 10, unlike the growth of monocrystalline silicon. Steps to make masks to localise or not to localise the porous zones may be done or may be omitted as in the variant described above.

It would be possible to localise only one of the two porous silicon layers, for example in the lower layer only. This has an advantage when it is required to maximise the coverage of the mechanical structure by the porous material while providing the structure with excellent mechanical properties. The entire upper surface of the mechanical structure is then covered by porous material, while no porous silicon is added on the lower surface below some important parts of the mechanical structure such as anchors, piezoresistive gauges, etc.

The porous zones 10 and 14 may be made of different materials and may have different thicknesses and/or different shapes.

According to another variant, surfaces of the mechanical structure other than the lower and the upper faces are covered with porous material, for example such as the lateral surfaces in order to further maximise the porous surface area or to benefit from anti-stiction properties of surfaces that have been made porous.

These porous lateral zones may be made using the same techniques as above, for example by applying vapours to the structure after it has been formed to make the exposed silicon surfaces porous. Such structures will be described later.

The mechanical structure may be made using materials other than silicon. As a non-limitative example, the mechanical structure may be made of SiGe, the porous areas 10 and 14 may be made of porous SiGe while the intermediate layer is made of non-porous SiGe or SiC, the porous zones 10 and 14 being made of porous SiC and the intermediate layer being made of non-porous SiC. Nevertheless, SiC has grain boundaries and an amorphous structure, possibly making it more difficult to control the current if porosity is formed by the anodisation process.

Silicon, if it is used, may be monocrystalline or polycrystalline.

The initial element in the example described above is an SOI substrate, but this is not in any way limitative. With the process according to the invention, the initial element comprises at least one substrate acting as support and a layer of material capable of forming a sacrificial layer. The nature of the material from which the sacrificial layer is made is preferably different from the nature of the materials in the porous layers and the layer 12, to achieve very good selectivity during the step in which the mechanical structure is released. For example the material used for the sacrificial layer may be $SiO_2$ for a silicon mechanical structure, or SiGe for a silicon mechanical structure.

As a variant, the sacrificial layer may be made from a material of the same nature as the material for the mechanical structure, for example it could be silicon to which a special treatment has been applied to modify its etching rate in comparison with other materials in the structure, this treatment for example possibly being a particular silicon doping.

Note that the sacrificial layer does not necessarily cover the entire surface of the substrate, it may cover only a part corresponding to the zone in which the mechanical structure will be released.

We will now describe another example of a process according to the invention in which the initial element is not an SOI substrate.

In this example, the initial element is a substrate made of a semiconducting material on which a layer made of a sacrificial material is formed, for example by oxidation of the substrate or by deposition.

During a next step, a layer of semiconducting material, for example silicon, is formed on the sacrificial layer for example by deposition. This layer may also be formed by epitaxy or it may be added on using a layer transfer technique such as molecular or anodic bonding or other, as is known in the state of the art (as described below for the intermediate layer). This layer is then made porous. The porous zones are not localised in the example described. But such localisation can be obtained by using a mask prior to the porosification step as described above. Porosification is done as also described above.

During the next step, the intermediate layer is made either by deposition, for example of polycrystalline silicon or by epitaxy, for example if the previous layer is made of a monocrystalline material and it is required to maintain this characteristic. But it would also be possible to use layer transfer techniques such as wafer-wafer bonding, for example by using molecular or anodic bonding, etc.; and grinding techniques for removing "handle" wafers that provide mechanical support during manipulation operations necessary for transferring layers. Temporary handle techniques may also be used for these layer transfers, as known in the state of the art for transferring wafers and layers.

A new porous layer is made during a next step. This layer can be obtained by making the intermediate layer porous over part of its thickness, either by forming a porous layer on the intermediate layer directly, or by forming a layer that is made porous later, or by adding on a layer that is porous or will be made porous using wafer-wafer bonding techniques as mentioned above. As mentioned above, the porous zones are not localised in this example of the process. But they can be localised using a mask formed prior to porosification. This step may be applied to the formation of the first layer on the sacrificial layer.

During a next step, the mechanical structure is made in the stack in the same way as described above.

During a next step, the mechanical structure is released by removing all or some of the sacrificial layer, for example using hydrofluoric acid in the case of an oxide layer.

It will be understood that the steps in the formation of the porous zones described above are also applicable to the process described with reference to FIGS. 1A to 1H.

We will now describe mechanical structures obtained with the process according to the invention.

Figure 2A:
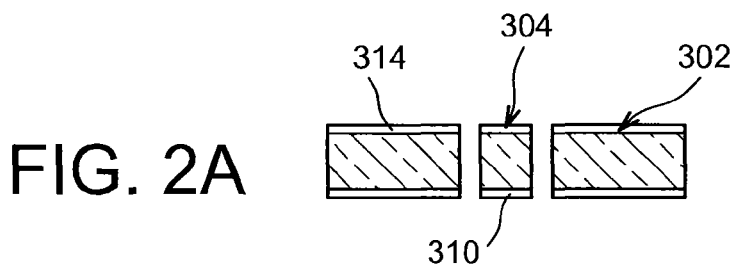
FIGS. 2A and 2B are top and cross sectional views respectively of an example structure obtained using the process according to the invention, the layers of porous material covering the entire surface of the inner and upper faces of the structure.
Figure 2B:
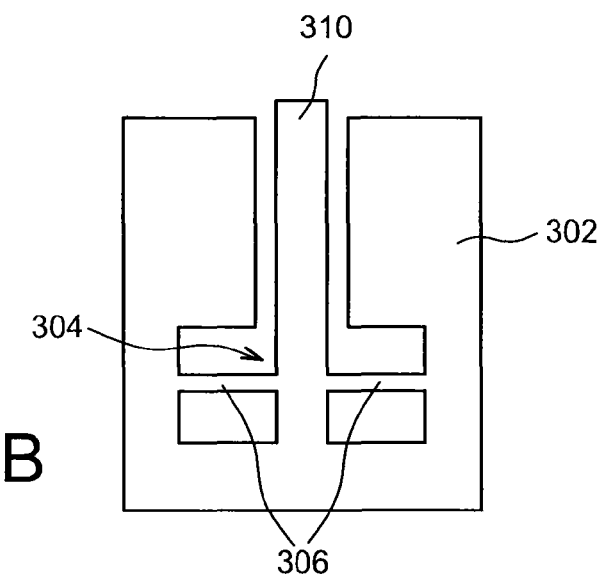

FIGS. 2A and 2B show an embedded-free beam type structure comprising a fixed part 302, a mobile part 304 in the form of a beam suspended by a longitudinal end from the fixed part, electrostatic type actuation means formed by electrodes supported by the fixed part facing the side flanks of the beam 304. The beam is then excited in-plane but it may displace in any direction depending particularly on the excited resonance mode. The structure also comprises detection means to detect displacement of the beam, formed by two piezoresistive gauges 306 mounted differentially. In this example, the entire lower face and the entire upper face of the structure are covered by a porous layer 310, 314. The porous zones were not localised during fabrication. The actuation means remain free of porous material on their flanks in this example embodiment.

Figure 2C:
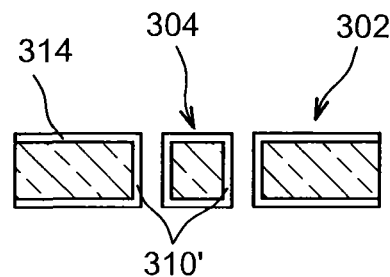
FIGS. 2C and 2D are top and cross sectional views respectively of a variant of the structure in FIGS. 2A and 2B, FIGS. 3A and 3B are top and cross sectional views respectively of an example structure obtained with the process according to the invention, the zones made of porous material being localised on the inner and upper faces of the structure.
Figure 2D:
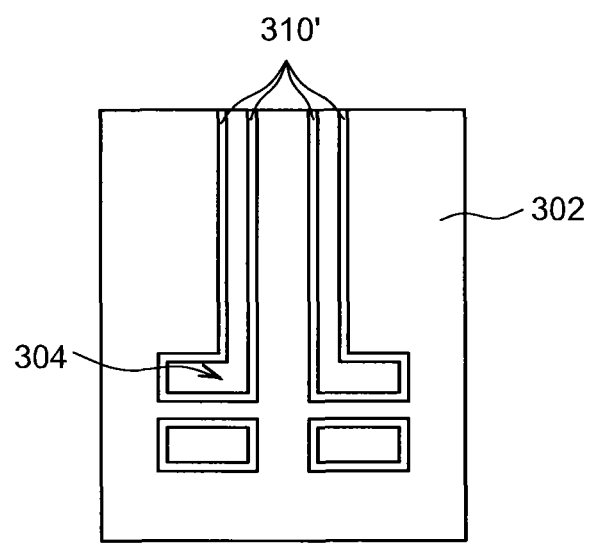

FIGS. 2C and 2D show a variant of the structure in FIGS. 2A and 2B, in which the lateral surfaces of the mobile part 304 and of the faces facing the fixed part 302 each comprise a porous layer 310'.

Figure 3A:
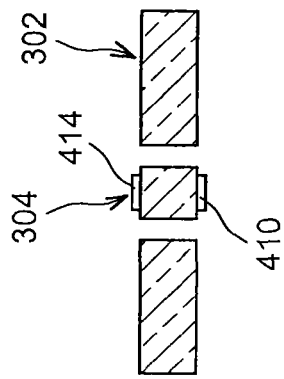
Figure 3B:
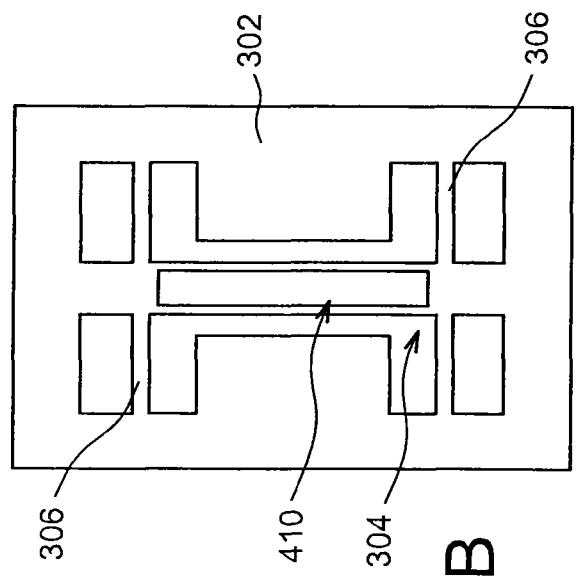

FIGS. 3A and 3B show the same structure as that shown in FIGS. 2A and 2B, however this structure is different in that the porous zones are localised on the mobile part. The actuation and measurement parts are not covered by porous material.

Figure 4A:
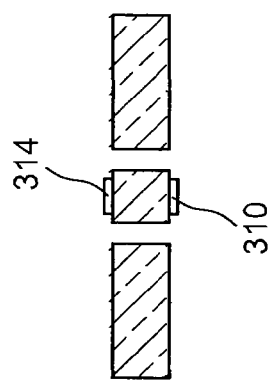
FIGS. 4A and 4B, 5A and 5B and 6A and 6B are top and cross sectional views respectively of other example structures obtained using the process according to the invention, the zones of porous material being localised on the inner and upper faces of the structure.
Figure 4B:
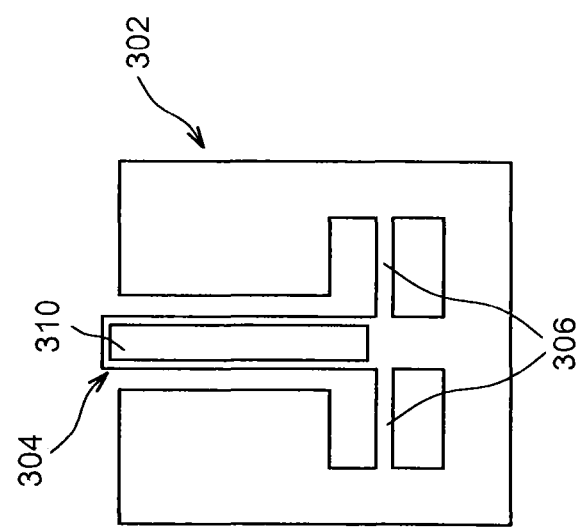

FIGS. 4A and 4B show a structure in which the free part is of the embedded-embedded beam type at its two longitudinal ends, and the measurement means comprise two pairs of piezoresistive gauges 306, each pair of gauges being located at the longitudinal ends of the beam. In this example, the porous zones 410 414 are localised on the mobile part 304. The actuation and measurement parts are not covered by porous material.

Figure 5A:
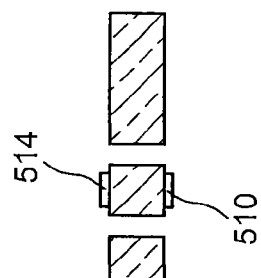
Figure 5B:
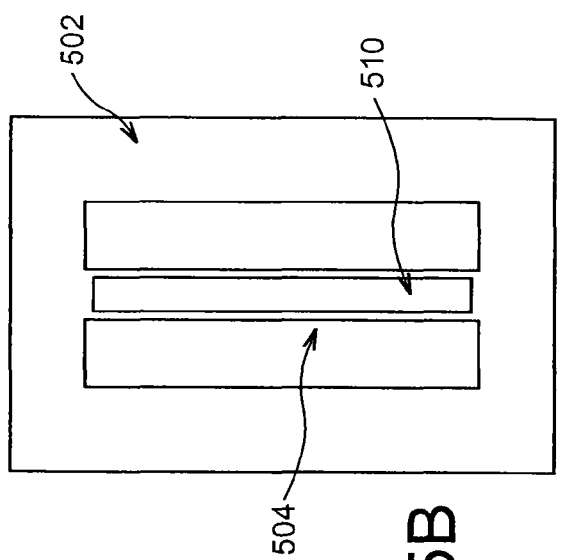

FIGS. 5A and 5B A show a structure in which the free part 504 is of the embedded-embedded beam at each of its two longitudinal ends on the fixed part 502, the beam for example being formed by a NEMS type nanowire. The actuation means may for example be of the electrostatic type like those described for the structure in FIGS. 2A and 2B and the detection means are of the capacitive type also using lateral electrodes. As a variant, the detection means may be of the piezoresistive type using elongation and contraction effects of the nanowire directly during its lateral movements, which induce internal stresses modifying the electrical resistance of the nanowire. In this example, the porous zone is localised at the nanowire.

Figure 6A:
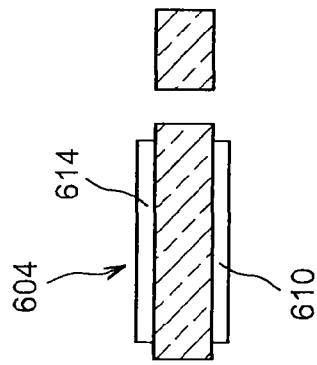
Figure 6B:
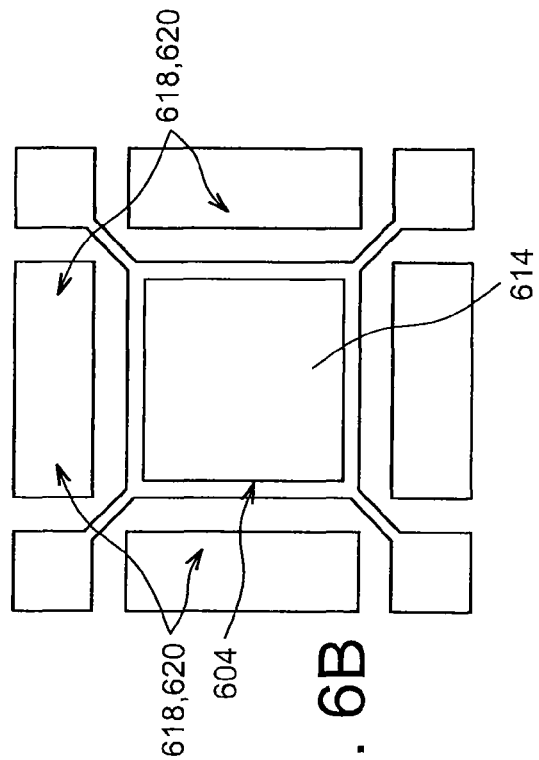

FIGS. 6A and 6B show an example of a "square plate" type bulk wave resonant structure, in which the mobile part 604 is formed from a parallelepiped shaped plate suspended from the fixed part at its four corners by beams.

The actuation means 618 are for example of the electrostatic type and the detection means 620 are for example of the capacitive type, the electrodes being located at the lateral edges. In this example, the porous zones 610, 614 are localised on the lower and upper faces of the suspended plate 604.

In the case of an intermediate layer made of monocrystalline silicon and porous layers made of silicon, the process according to the invention can be used to make a structure combining the advantages of monocrystalline silicon as the material for the mechanical structure and the advantages of a porous structure as the interface material with the surrounding environment. Monocrystalline silicon has a high Young's modulus, a high quality factor for resonant structures and it has no intrinsic stresses nor fatigue phenomena. Its reliability in the MEMS field has also been demonstrated. Regarding the use of porous layers, it can increase the adsorption surface area, for example with a gaseous medium. Furthermore, porous silicon does not introduce any significant residual stresses such that it can easily be applied on released mechanical structures without causing any undesirable deformations.

In the case of a structure in which the actuation and/or detection means are capacitive, the electrodes may be located on the substrate facing the lower face of the mobile part, and with the process according to the invention, the lower face is not necessarily covered with porous material because the porous layer can be localised on the lower surface and the upper surface differently.

With the invention, the adsorption surface area formed by the porous layers is maximised in comparison with the state of the art because the process according to the invention is capable of making these layers on the lower and upper faces of all or some of the mechanical structure, therefore the sensitivity is enhanced, for example for humidity sensors, chemical or biological sensors, etc., while maintaining the mechanical properties of monocrystalline silicon.

Furthermore, the process according to the invention is capable of localising porous zones on the mechanical structure on useful parts only, and thus not forming porosity at the actuation means, for example adjacent lateral faces in the case for example of electrostatic actuation as was described with the examples of structures in FIGS. 2A to 6B or at transduction means, for example such as piezoresistive gauges (FIGS. 2A to 4B). Porosification of silicon modifies its characteristics (reduction of Young's modulus, increase in thermal insulation, reduction in electrical conductivity, etc.) which is usually not desirable for much of the mechanical structure. Similarly, it might be preferable to avoid forming porous zones on deforming surfaces to prevent an increase in dissipation phenomena that can deteriorate the quality factor of a resonant structure. Furthermore, with the process according to the invention, porous zones can be localised differently on the upper and lower surfaces, which has the advantages mentioned above of optimising crystalline quality of the intermediate material in some zones, or avoiding having a porous surface on an electrode under the mobile structure while maximising the porous zone on the surface of this structure for stronger interaction with the external medium.

Finally, by making porous zones on both faces of the structure, an equilibrium is set up between any residual stresses existing in the layer of porous silicon that could possibly induce parasite curvature of the mobile structure if only one of the faces were porous.

It will be understood that the advantages mentioned above are also present in a mechanical structure comprising a stack of two porous layers on each side of an intermediate material, one of the layers, two of these layers or the three layers not necessarily being based on silicon. The material from which the intermediate layer is made is nevertheless chosen to have good mechanical properties.

The fabrication process according to the invention can be used to make MEMS and/or NEMS type devices for any type of application, particularly any type of sensor designed to adsorb species of interest, for example humidity sensors, chemical sensors, biological sensors, or mass spectrometry systems using NEMSs. This process may also be used on any type of structure on which a porous layer is used for its adsorption properties but also for its particular thermal and/or electrical properties.

The fabrication process according to the invention may be used for the fabrication of gas phase chromatography columns incorporating MEMSs.

The invention claimed is:

1. Process for fabrication of a micromechanical and/or nanomechanical structure comprising the following steps, starting from an element comprising a support substrate and a sacrificial layer:
   a) formation of a first layer on the sacrificial layer, at least part of the first layer being porous;
   b) formation, on the first layer, an intermediate layer configured to provide the mechanical properties of the structure;
   c) formation of a second layer on the intermediate layer to provide a stack including the first layer, the intermediate layer and the second layer, at least part of the second layer being porous;
   d) formation of said micromechanical and/or nanomechanical structure in the stack composed of the first layer, the intermediate layer and the second layer; and
   e) release of said structure by at least partial removal of the sacrificial layer.

2. Fabrication process according to claim 1, in which the porous part of the second layer is at least partially superposed on the porous part of the first layer.

3. Fabrication process according to claim 1, in which the part of the first layer and/or the part of the second layer has an open type porosity.

4. Fabrication process according to claim 1, in which the materials in the first and/or second porous layers are chosen independently among semiconductors, dielectrics.

5. Fabrication process according to claim 4, in which the materials in the first and/or second porous layers are low permittivity dielectrics.

6. Fabrication process according to claim 1, in which step a) and/or step c) comprise a step for the deposition, growth or transfer of a layer onto the sacrificial layer and/or the intermediate layer.

7. Fabrication process according to claim 6, in which the porous part of the first and/or the second layer is localised.

8. Fabrication process according to claim 7, in which localisation is achieved by localised deposition, growth, transfer or localised etching.

9. Fabrication process according to claim 6, in which step a) and/or step c) comprise a step to porosity at least one part of said layer.

10. Fabrication process according to claim 9, in which a mask is made on said layer before the porosification step is done, so as to localise at least one zone of material to be made porous.

11. Fabrication process according to claim 9 in which porosification can be achieved electrochemically or by stain etching.

12. Fabrication process according to claim 1, in which step d) in which said structure is formed in the stack composed of the first layer, the intermediate layer and the second layer comprises a lithography and anisotropic etching step of said stack.

13. Fabrication process according to claim 1, in which the structure is released by isotropic etching of the sacrificial layer.

14. Fabrication process according to claim 1, in which the material of the sacrificial layer is different from the material of the first layer, the second layer and the intermediate layer.

15. Fabrication process according to claim 1, in which the first and second layers are made of porous silicon and the intermediate layer is made of monocrystalline silicon.

16. Fabrication process according to claim 1, in which the first and second layers are made of porous SiGe and the intermediate layer is made of non-porous SiGe.

17. Fabrication process according to claim 1, in which the first and second layers are made of porous SiC and the intermediate layer is made of non-porous SiC.

18. Fabrication process according to claim 1, in which the structure comprises a fixed part and a suspended part on a support, and an actuating part configured to actuate the suspended part, and a detecting part configured to cause displacement of the suspended part, the suspended part being provided with at least one porous zone formed during steps a) and c) on a first face of the suspended part facing the support and on a second face of the suspended part opposite the first face.

19. Fabrication process according to claim 18, in which the actuating part is electrostatic and comprises electrodes located on flanks of the fixed and suspended parts without any porous zone.

20. Fabrication process according to claim 18, in which the detecting part is capacitive and comprises electrodes located on flanks of the fixed and suspended parts without any porous zone.

21. Fabrication process according to claim 18, in which the detecting part comprises piezoresistive gauges extending between the fixed part and the suspended part, said gauges not being provided with a porous zone.

22. Fabrication process according to claim 18, in which one or several porous lateral layers are also formed on flanks of the suspended part and/or the fixed part.

23. Fabrication process according to claim 1, in which the micromechanical and/or nanomechanical structure is used for fabrication of a chemical and/or biological sensor, and/or a humidity sensor, the porous zones being designed to adsorb molecules of interest.

24. Fabrication process according to claim 1, wherein the part of the first layer and/or the part of the second layer are at least one of microporous, mesoporous or macroporous.

25. Process for fabrication of a micromechanical and/or nanomechanical structure comprising the following steps, starting from an element comprising a support substrate and a sacrificial layer:
   a) formation of a first layer on the sacrificial layer, at least part of the first layer being porous;
   b) formation, on the first layer, an intermediate layer configured to provide the mechanical properties of the structure;
   c) formation of a second layer on the intermediate layer to provide a stack including the first layer, the intermediate layer and the second layer, at least part of the second layer being porous;
   d) formation of said micromechanical and/or nanomechanical structure in the stack composed of the first layer, the intermediate layer and the second layer; and
   e) release of said structure by at least partial removal of the sacrificial layer,
   wherein the material from which the first and/or second layer is made is a P-doped.

26. Process for fabrication of a micromechanical and/or nanomechanical structure comprising the following steps, starting from an element comprising a support substrate and a sacrificial layer:
   a) formation of a first layer on the sacrificial layer, at least part of the first layer being porous;
   b) formation, on the first layer, an intermediate layer configured to provide the mechanical properties of the structure;
   c) formation of a second layer on the intermediate layer to provide a stack including the first layer, the intermediate layer and the second layer, at least part of the second layer being porous;
   d) formation of said micromechanical and/or nanomechanical structure in the stack composed of the first layer, the intermediate layer and the second layer; and
   e) release of said structure by at least partial removal of the sacrificial layer,
   wherein the material from which the intermediate layer is made is a monocrystalline material.

27. Fabrication process according to claim 26, in which step b) comprises the step for epitaxial growth of the intermediate layer on the first layer.

* * * * *